(12) United States Patent
Pätzold et al.

(10) Patent No.: US 12,052,878 B2
(45) Date of Patent: Jul. 30, 2024

(54) SEMICONDUCTOR MODULE AND METHOD FOR PRODUCING SAME

(71) Applicant: ASCA GmbH, Kitzingen (DE)

(72) Inventors: Ralph Pätzold, Roth (DE); Pavel Schilinsky, Bremen (DE); Bas Cedric Van Der Wiel, Nuremberg (DE)

(73) Assignee: ASCA GmbH, Kitzingen (DE)

( * ) Notice: Subject to any disclaimer, the term of this patent is extended or adjusted under 35 U.S.C. 154(b) by 0 days.

(21) Appl. No.: 18/262,457

(22) PCT Filed: Dec. 21, 2021

(86) PCT No.: PCT/EP2021/086934
§ 371 (c)(1),
(2) Date: Jul. 21, 2023

(87) PCT Pub. No.: WO2022/156981
PCT Pub. Date: Jul. 28, 2022

(65) Prior Publication Data
US 2024/0049488 A1    Feb. 8, 2024

(30) Foreign Application Priority Data
Jan. 21, 2021   (DE) ..................... 10 2021 200 540.3

(51) Int. Cl.
| | |
|---|---|
| *H10K 39/10* | (2023.01) |
| *G06F 3/044* | (2006.01) |
| *H10K 39/18* | (2023.01) |
| *H10K 39/30* | (2023.01) |
| *H10K 30/88* | (2023.01) |
| *H10K 102/10* | (2023.01) |

(52) U.S. Cl.
CPC ............ *H10K 39/18* (2023.02); *G06F 3/0445* (2019.05); *H10K 39/30* (2023.02); *H10K 30/88* (2023.02); *H10K 2102/10* (2023.02)

(58) Field of Classification Search
CPC ....... H01L 31/00–078; Y02E 10/50–60; H02S 50/00–10; H10K 39/10–18
USPC .................................................. 136/243–265
See application file for complete search history.

(56) References Cited

U.S. PATENT DOCUMENTS

| | | |
|---|---|---|
| 9,865,576 B1 | 1/2018 | Yang |
| 2010/0079387 A1 | 4/2010 | Rosenblatt et al. |

(Continued)

FOREIGN PATENT DOCUMENTS

| | | | |
|---|---|---|---|
| CN | 104609359 B | * | 3/2016 |
| WO | WO-2020011699 A1 | * | 1/2020 |

OTHER PUBLICATIONS

CN-104609359-B English (Year: 2016).*
WO-2020011699-A1 English (Year: 2020).*

*Primary Examiner* — Bach T Dinh
(74) *Attorney, Agent, or Firm* — Laurence A. Greenberg; Werner H. Stemer; Ralph E. Locher

(57) ABSTRACT

A semiconductor module has a layer structure and at least one capacitive sensor. The layer structure is formed with an upper electrode layer, a lower electrode layer, and an active layer arranged between the electrode layers. The active layer is made of a semiconductor material. The capacitive sensor has a measuring electrode which is integrated into the layer structure. There is also described a device which has such a semiconductor module and a method for producing such a semiconductor module.

12 Claims, 3 Drawing Sheets

(56) References Cited

U.S. PATENT DOCUMENTS

| | | |
|---|---|---|
| 2013/0050147 A1* | 2/2013 | Tseng .................. G06F 3/0421 |
| | | 178/18.09 |
| 2014/0125603 A1 | 5/2014 | Lin |
| 2015/0199062 A1 | 7/2015 | Lang |
| 2017/0010712 A1 | 1/2017 | Yoshizumi et al. |

\* cited by examiner

SEMICONDUCTOR MODULE AND METHOD FOR PRODUCING SAME

FIELD AND BACKGROUND OF THE INVENTION

The invention relates to a semiconductor module, in particular an organic photovoltaic module, and also a device comprising such a semiconductor module, and a method for producing such a semiconductor module.

A semiconductor module usually comprises a layer structure having two electrode layers and an active layer arranged therebetween. The layer structure realizes a specific function of the semiconductor module. In the case of a photovoltaic module, for example, light is absorbed in the active layer and a current is thereby generated, which can be tapped off by way of the electrode layers. The electrode layers and the active layer are typically structured during the production of the semiconductor module, e.g. in order to form a plurality of cells in the case of a photovoltaic module, which cells are then interconnected in series and/or in parallel with one another in order to attain specific electrical characteristic values (e.g. current or voltage).

In principle, it is desirable, in addition to a first, original function of a semiconductor module, to combine the latter with one or more other functions. By way of example, in the case of a photovoltaic module, the original function is to generate current. Photovoltaic modules find diverse application and are integrated into a wide variety of objects, including everyday objects, in order to supply these with current. By way of example, it is conceivable to provide a keyboard with a photovoltaic module in order to supply this keyboard with current. The keyboard then offers an additional function, namely a possibility of input by way of corresponding keys. What is problematic, in principle, is that a photovoltaic module require a certain area in order to generate current in a practical way, as a result of which the possibility for realizing another function on the same object is limited. Specifically, in the case of a keyboard, the area available for keys would be reduced by the photovoltaic module, and so the keyboard would potentially need to be enlarged.

SUMMARY OF THE INVENTION

Against this background, it is an object of the invention to specify an improved semiconductor module, a device which uses such a semiconductor module, and also a method for producing such a semiconductor module. The semiconductor module is intended to be equipped additionally with a second function besides a first, original function. The intention is thereby to attain the highest possible functional density.

The object is achieved according to the invention by means of a semiconductor module having the features as claimed, a device having the features as claimed, and also by means of a method having the features as claimed. The dependent claims relate to advantageous configurations, developments and variants. The explanations in connection with the semiconductor module analogously also apply to the device and to the method, and vice versa. Moreover, the object is also achieved in particular by means of a use of the semiconductor module in a device.

The semiconductor module comprises a layer structure and at least one capacitive sensor. The layer structure comprises an upper electrode layer and a lower electrode layer and also an active layer, which is arranged between the electrode layers and is produced from a semiconductor material. The active layer is also referred to as a functional layer and determines in particular a first, original function of the semiconductor module. The capacitive sensor then realizes a further, different function.

The semiconductor module is preferably configured as an organic photovoltaic module and, for this purpose, the layer structure is configured for generating current by means of absorption of light in the active layer. For this purpose, the active layer is fabricated from one or more organic semiconductor materials. The photovoltaic module accordingly serves to generate energy by converting light. The first, original function of the semiconductor module is then to generate current. It is assumed hereinafter, without restricting the generality, that the semiconductor module is an organic photovoltaic module; however, the explanations analogously also apply to non-organic photovoltaic modules and to other organic and non-organic semiconductor modules, e.g. OLED modules or electronic paper (so-called "e-paper") and the like. In the case of an OLED module or electronic paper, the first, original function is then illumination or display e.g. of images or information. Especially an organic semiconductor module is preferred, since such a semiconductor module is able to be fashioned particularly flexibly and so primarily the design, i.e. the optical appearance, of the semiconductor module is able to be fashioned substantially in any desired way. Moreover, an organic semiconductor module is particularly thin, flexurally flexible and mechanically robust. Production, too, affords distinct advantages; in this regard, a "roll-to-roll" method is preferably used, having high manufacturing speed.

The capacitive sensor is also referred to for short just as "sensor". The sensor preferably serves as an input element, in particular as a key, and is accordingly operable from outside by a person, e.g. using a finger. The capacitive sensor is thus a touch sensor, in particular. Accordingly, the semiconductor module with integrated sensor is a touch-sensitive semiconductor module. The sensor is based on the principle that a change in capacitance is detected which results from a change in the surroundings of the sensor. In principle, this requires two electrodes, which together form a capacitor; in this case, however, it is already sufficient if the actual sensor comprises only one of the two electrodes and the other electrode is formed by a moving object, e.g. a finger. The electrode of the sensor is referred to as a measuring electrode and is connected in particular to a suitable evaluation unit, the exact configuration of which is however initially not of further significance. A change in the environment (typically at a distance of ≤1 mm) of the measuring electrode typically leads to a charge transfer in said measuring electrode, which is then measured by the evaluation unit. An approach to the sensor by a finger and thus an actuation of the input element are recognized in this way.

As already indicated, the capacitive sensor described here in the present case comprises a measuring electrode. In one suitable configuration, the sensor is identical with the measuring electrode; alternatively, the sensor additionally comprises a signal line connected to the measuring electrode. The measuring electrode is integrated into the layer structure. The sensor is thus advantageously a part of the layer structure of the semiconductor module that already exists anyway. This layer structure realizes firstly the original function of the semiconductor module and now additionally also a further, different function as a result of the integration of the sensor. In the example of the photovoltaic module with input element, the two functions of "generating current" and "input function" are then integrated in the layer structure of the semiconductor module.

In principle, it is conceivable to realize a further function by a corresponding module simply being placed onto a semiconductor module, for example by a separate layer structure with a capacitive sensor being placed onto a layer structure of a photovoltaic module. The two layer structures are fabricated separately from one another and then simply brought together. However, the present invention has gone further and realized particularly deep integration of the further function by integrating the capacitive sensor directly into that very layer structure which actually realizes the original function. In this case, a part of the layer structure is as it were rededicated and taken away from the original function in order instead to realize a different function. In this case, however, in particular no other materials are used for the sensor, rather the sensor is produced in a suitable manner completely from materials which are used anyway to realize the original function. In the example of the photovoltaic module, in particular a part of the layer structure is then no longer used to generate current by absorption of light, but rather as a capacitive sensor, specifically as an input element. On account of the high integration, the production of the semiconductor module is also particularly simple since the production of the capacitive sensor advantageously takes place simultaneously with the production of the layer structure. This makes use of the knowledge that, in a semiconductor module, specifically within the layer structure thereof, conductive material is already used at various points and can accordingly be rededicated by means of suitable measures during production and, as a result, is then usable as a measuring electrode of a capacitive sensor. The outlay for producing the sensor is then particularly low. The only disadvantage is that a part of the layer structure is possibly lost for the original function, but this is accepted in the present case.

Firstly, one preferred configuration of a method suitable in principle for producing a semiconductor module, specifically an organic photovoltaic module, will be described below. In principle, individual steps of this method can be used, modified, replaced or omitted independently of one another.

Preferably, during the production of the semiconductor module, in a first step, the upper electrode layer is formed, specifically from a conductive material. The upper electrode layer is preferably fabricated from a transparent material, preferably ITO, IMI or the like, and thus as a transparent electrode layer. The material is applied to a carrier layer, in particular, which is likewise fabricated from a transparent, but electrically insulating material, in particular a plastic, e.g. PET. The carrier layer is usually 2 to 3 orders of magnitude thicker than the electrode layer and primarily serves as a robust substrate during production.

The first step is preferably followed by a second step, in which the active layer is applied to the upper electrode layer. The active layer is fabricated from one or more individual layers, each of which consists of an active material. The active layer typically consists of a mixture of two different active materials. The active materials are preferably organic semiconductor materials. The individual layers and thus the active layer overall are applied by an application installation, preferably by means of "slot-die coating" or a comparable method.

The upper electrode layer is either formed directly in a structured fashion or firstly fabricated in a continuous fashion, i.e. in an unstructured fashion, and subdivision into a plurality of electrodes, which are electrically isolated from one another, then takes place for example after the application to the carrier layer and before the application of the active layer or alternatively after the application of the active layer. Structuring of the upper electrode layer before the application of the active layer is designated as P1 for short. By contrast, structuring of the upper electrode layer after the application of the active layer is designated as P1* for short. A P1 structuring step and a P1* structuring step usually lead to comparably good results, but a P1* structuring step has specific advantages during production. A number of separating points that subdivide the upper electrode layer into a plurality of upper electrodes are formed during the structuring of the upper electrode layer. For this purpose, the material of the upper electrode layer is removed regionally, such that a cutout in the upper electrode layer arises at a respective separating point.

In a third step, the active layer is preferably structuring in such a way that a number of contact points are formed, at which the upper electrode layer is exposed. In other words: the active layer is perforated at a number of contact points, without the upper electrode layer being perforated in the process, in order later to be contacted with the lower electrode layer. The structuring of the active layer where the active layer is completely perforated is also referred to as a second structuring step, P2 for short. A P1* structuring step—if used—is expediently carried out at the same time as the P2 structuring step.

In the third step, depending on the configuration, preferably, the active layer is additionally only partly perforated at partial interruption points, that is to say that at least one of the individual layers is perforated, but another of the individual layers is not perforated, i.e. remains intact. Such structuring of the active layer where the active layer is only partly perforated is also referred to as a third structuring step, P3 for short.

The third step is preferably followed by a fourth step, in which the lower electrode layer is then applied to the active layer. The lower electrode layer is fabricated from a conductive material, preferably from a metal, particularly preferably from silver. The lower electrode layer is preferably configured as a grid electrode. Expediently, the lower electrode layer is already formed in a structured fashion, i.e., with a plurality of lower electrodes, analogously to the upper electrode layer. However, subsequent structuring analogously to the upper electrode layer is also conceivable and suitable.

The identification of the electrode layers as upper and lower electrode layers is basically arbitrary. The identification chosen here assumes that the upper electrode layer is the primarily forward-facing and visible layer on the front side of the semiconductor module, by way of which light is then also incident in the case of a photovoltaic module or light is output in the case of an OLED module. The lower electrode layer then lies below or behind that and on a rear side of the semiconductor module.

Finally, in a fifth step, the stack comprising carrier layer, active layer and electrode layers is expediently encapsulated, namely surrounded by a protective cover, in order to protect the arrangement against environmental influences, e.g. the weather. The protective cover is fabricated for example from a transparent plastic, e.g. PET, alternatively from a metal on at least one side, which metal affords particularly good protection but is not light-transmissive and is therefore suitably used only on the rear side. Alternatively, the protective cover is formed on the front side by means of the carrier layer and an additional protective layer is applied only on the rear side.

The two electrode layers and optionally also the protective cover are thus fabricated in each case from a conductive material and are therefore suitable in each case for forming the measuring electrode of the sensor.

Preferably, the measuring electrode is potential-free; this is also referred to as "floating voltage". Accordingly, "potential-free" is understood to mean that the measuring electrode is not actually connected to a reference potential, specifically a ground potential, but rather is independent. This is entirely sufficient for forming a capacitive sensor. However, that also means, in particular, that the measuring electrode is not connected to a potential of the rest of the semiconductor module, but rather is electrically isolated therefrom and thus independent thereof. By way of example, a photovoltaic module comprises a positive pole and a negative pole, which are formed by the electrodes of the two electrode layers. The measuring electrode is then connected neither to the positive pole nor to the negative pole. If the sensor comprises just a single measuring electrode, the semiconductor module preferably also comprises merely a single connection pole, i.e. a merely single-pole connection, for the sensor.

Since the electrode layers are typically structured anyway in order to realize the original function of the semiconductor module, in the process expediently the measuring electrode of the sensor is formed as well and for this purpose is as it were cut out of one of the electrode layers and electrically insulated from the rest of the electrode layer. In a suitable configuration for this, in the case of the semiconductor module, at least one of the electrode layers is structured and thereby comprises a plurality of partial regions which are electrically isolated from one another. One of the plurality of partial regions then forms the measuring electrode. The measuring electrode is thereby integrated into the layer structure. The other partial regions (one or more depending on the configuration) then each form in particular an electrode of a respective cell of the semiconductor module.

Expediently, the other electrode layer is likewise structured, in particular in an analogous manner, specifically in such a way that in this case, too, an electrode is formed for each cell of the semiconductor module. For a measuring electrode as a partial region of one of the electrode layers, however, a counterpart need not necessarily be produced in the other electrode layer, that is to say that the number of partial regions in the two electrode layers need not necessarily be identical, so that the measuring electrode is then embodied as just a single ply, but this is the case in a preferred configuration and the measuring electrode is double-plied and in this case is composed of a respective partial region in both electrode layers. In the case where the measuring electrode is embodied in one of the electrode layers, the sensor is then integrated directly into the layer structure. The measuring electrode is situated spatially in a plane with the electrodes of the corresponding electrode layer. Moreover, the measuring electrode then consists of the same material from which the electrode layer is produced.

The electrode layer is suitably structured by a procedure in which said electrode layer is firstly applied over the surface, i.e. in continuous fashion, and is then partially removed subsequently in a structuring step, e.g. by means of a laser. This is preferably carried out for the upper electrode layer, e.g. as described above as a P1 or P1* structuring step. Alternatively, the electrode layer is structured by a procedure in which said electrode layer is applied in structured fashion from the outset, i.e. is then applied only regionally. This is preferably carried out for the lower electrode layer, as described above in connection with the fourth step during production. In another suitable configuration, the measuring electrode is produced in an additional structuring step, for example after the application of the lower electrode.

The size, i.e. the dimensioning, of the measuring electrode is able to be fashioned basically in any desired way and is therefore expediently adapted to the envisaged application. Preferably, however, the size of the measuring electrode is chosen to be as small as possible here in order to obtain as much area of the semiconductor module as possible for the first, original function thereof. If the sensor is used as an input element, specifically for operation with a finger, it is sufficient and therefore expedient if the measuring electrode is configured with a square shape having an edge length of 1 mm to 10 mm, or in a different shape with an area of the same size.

In one particularly preferred configuration, the measuring electrode is formed from an upper part, which is a partial region of the upper electrode layer, and a lower part, which is a partial region of the lower electrode layer, wherein the upper part and the lower part are electrically connected by means of a via through the active layer. In this configuration, the production of the measuring electrode is completely integrable, and in particular actually integrated, into the production of the semiconductor module; specifically, the measuring electrode is produced completely by means of such method steps which are also used to produce the cells, e.g. as already described further above.

Generally, the layer structure is preferably structured, such that the latter comprises a plurality of cells. In this case, the via is then suitably produced jointly with one or more further vias by means of which the cells are electrically interconnected. The vias for connecting the cells are also referred to as cell vias. Both electrode layers in each case are structured in order to form the electrodes of the cells; at the same time here the upper part and the lower part are formed analogously to the electrodes, optionally with a different shape. Furthermore, one or more vias are formed which extend through the active layer and electrically connect the electrodes to one another in order to interconnect the cells in series or in parallel, or a combination thereof. In this case, a via is then also formed which connects the upper part to the lower part, such that these are then short-circuited. The upper part and the lower part are as it were dummy electrodes since these are basically produced like electrodes, but are not electrically connected to the other electrodes of the cells and, in this respect, are therefore not used for the original function of the semiconductor module, but rather only for the additional, other function. The upper part and the lower part are preferably formed such that one lies above the other, and indeed are not offset with respect to one another. It is suitable for the upper part and the lower part also to be of the same size and/or to have the same shape, apart from tolerances and differences governed by production engineering.

Aside from the possibility of short-circuiting the upper part and the lower part by means of the via and thereby uniting these parts to form a single measuring electrode, the via is preferably also used to indicate the position of the sensor to a user. In a suitable configuration, for this purpose, the via is visible from outside and thereby marks the position of the capacitive sensor in the semiconductor module. This is particularly advantageous if the sensor is used as an input element. The via is accordingly used here in a targeted manner as a marking. An additional marking, e.g. an imprint or the like, is then dispensable and is preferably omitted. In this way, the marking of the sensor is also completely integrated into the production of the semiconductor module, and so a separate method step is not necessary for this. Rather, the marking of the sensor takes place during the production of the vias.

The described marking by means of a via is also possible if the measuring electrode is produced just from one of the electrode layers. Accordingly, in that case the via does not serve for short-circuiting partial regions of the upper and lower electrode layers, rather only an upper part or only a lower part is present, but the via is nevertheless visible from outside and thereby marks the position of the capacitive sensor in the semiconductor module. Hereinafter, without restricting the generality, a measuring electrode having an upper part and a lower part is assumed, but the explanations also analogously apply to a measuring electrode only having an upper part or only having a lower part.

Preferably, the upper electrode layer is fabricated from a transparent material, such that the via and the active layer are visible through the upper electrode layer, i.e. in particular from outside. "Transparent" is understood to mean in particular "light-transmissive in the visible spectral range". Furthermore, the via is preferably produced from a different material than the active layer and thereby contrasts optically with the active layer. What is essential here is that the materials of the active layer and of the via are so different that these produce an optical contrast and the via is thereby visually delimitable from the active layer by a user. In one suitable configuration, the active layer and the via have different colors for this purpose.

A respective via is produced in particular by a procedure in which the active layer is structured in a structuring step, i.e. the active material is regionally removed or omitted from the outset, and instead electrically conductive material is then inserted. Preferably, the via of the measuring electrode is produced simultaneously with the lower electrode layer and is thus automatically produced from the same material as the lower electrode layer. In the case of a photovoltaic module with a lower electrode layer composed of silver, the via is then likewise produced from silver and visually well delimited from the material of the active layer. Especially in the case of a metal such as silver, for example, a particular advantageous optical appearance results since a via composed of metal brings about a corresponding light reflection, whereas the active material typically appears rather matt.

A configuration in which the via is configured in the form of a graphic character or pictorial symbol is particularly expedient. This makes it possible not only to indicate the position of the sensor, but also to specify a function linked therewith. This is particularly useful in the case of a sensor serving as an input element, specifically as a key, the actuation of which causes e.g. a specific function of the respective device to be activated or deactivated. This function is then represented directly by means of the via. In principle, it is also advantageous to form a plurality of vias for a single sensor in order to represent more complex images or combinations of a plurality of graphic characters.

In one suitable exemplary configuration, the device is a keyboard comprising a semiconductor module having a plurality of capacitive sensors that serve as input elements for a media player. Accordingly, the via of one of the sensors is marked with a "P" or an arrow ">" for the function "play", and another sensor with an "F" or ">|" for the function "forward", "FF" or "»" for the function "fast forward", and so on.

It is suitable for the semiconductor module to comprise a cutout on the rear side, for connecting the measuring electrode to an evaluation unit. The cutout is also referred to as "contact hole". The cutout is introduced in particular into a protective cover of the semiconductor module, such that the measuring electrode is electrically accessible. Analogously, the semiconductor module expediently also comprises a cutout, preferably two cutouts, for connecting the cells, more precisely the electrodes thereof, i.e. cutouts for a positive pole and a negative pole of the semiconductor module.

As an alternative or in addition to the described formation of the measuring electrode from one or both of the electrode layers, the measuring electrode is formed from a conductive side of a protective cover. In one suitable configuration, the layer structure accordingly comprises a protective cover, which is an outer cover of the semiconductor module, for protection against environmental influences, and the protective cover comprises at least one side which is produced from a conductive material and which forms the measuring electrode. The material is in particular a metal, for example aluminum, which has particular good barrier properties. Since the material is electrically conductive and is electrically isolated from the electrode layers, it is correspondingly likewise suitable as a measuring electrode. In principle, a protective cover as measuring electrode is also combinable with one or more measuring electrodes in one or both electrode layers.

The device according to the invention is in particular an input device, for example a keyboard, and comprises a semiconductor module as described above. In this case, the capacitive sensor serves as an input element, in particular as a key. Furthermore, the device expediently comprises an evaluation unit as already described, to which the measuring electrode is connected, for the purpose of evaluating a signal of the sensor. Such a signal is in particular a voltage that changes upon actuation of the sensor. The evaluation unit accordingly measures the voltage and repeatedly checks whether the voltage changes and whether an input has thus been effected.

The method according to the invention serves for producing a semiconductor module as described above. The semiconductor module accordingly comprises a layer structure and at least one capacitive sensor. The layer structure comprises an upper electrode layer and a lower electrode layer and also an active layer, which is arranged between the electrode layers and is produced from a semiconductor material. The capacitive sensor comprises a measuring electrode. An essential method step is then that the measuring electrode is integrated into the layer structure. Expedient configurations and details are evident from the statements already made.

BRIEF DESCRIPTION OF THE FIGURES

Exemplary embodiments of the invention are explained in greater detail below with reference to a drawing, in which, schematically in each case.

DETAILED DESCRIPTION OF THE INVENTION

Figure 1:
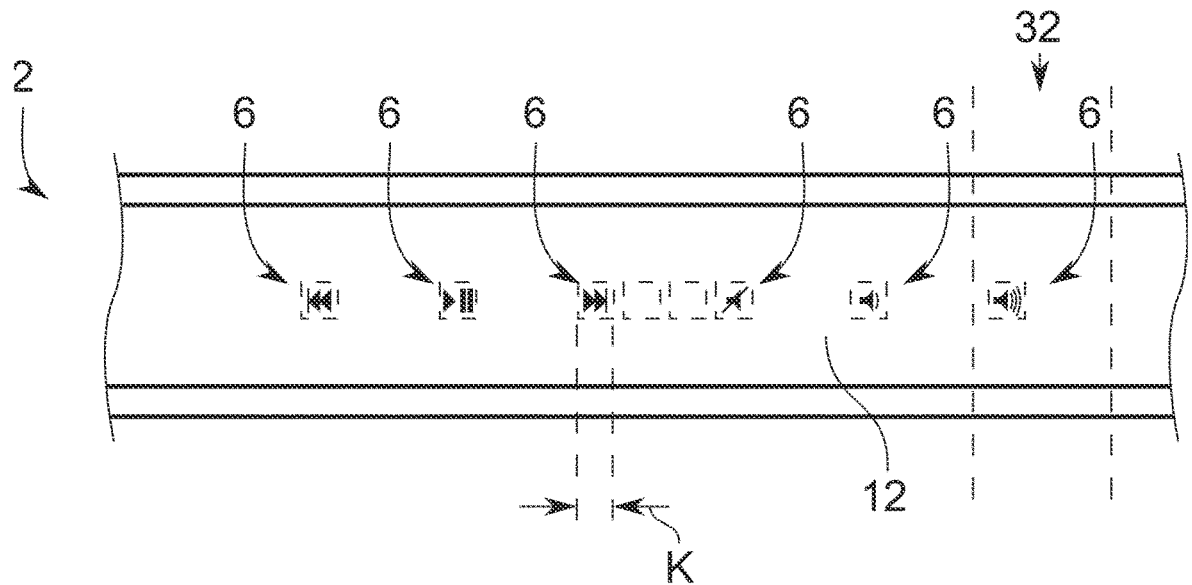
FIG. 1 shows a detail from a semiconductor module in a front view.
Figure 2:
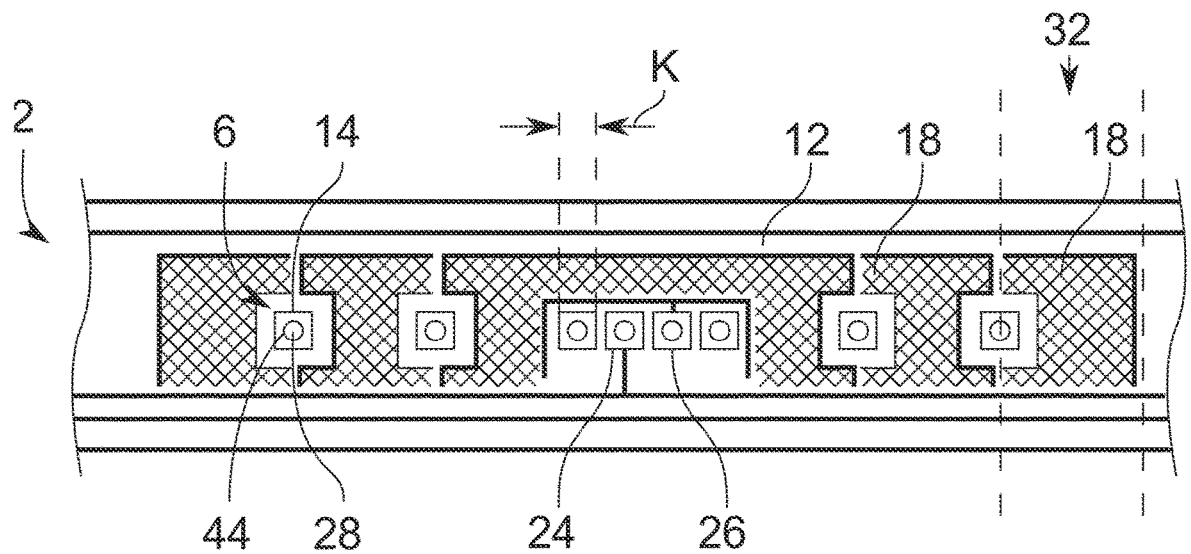
FIG. 2 shows a detail from the semiconductor module from FIG. 1 in a rear view.
Figure 3:
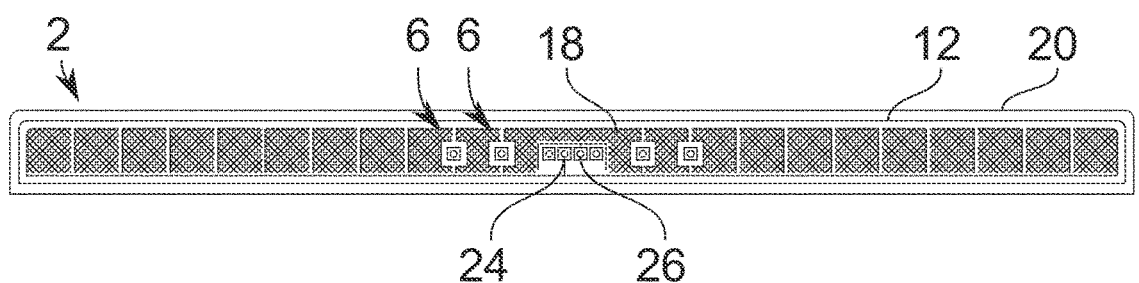
FIG. 3 shows the entire semiconductor module from FIG. 1 in a rear view.
Figure 4:
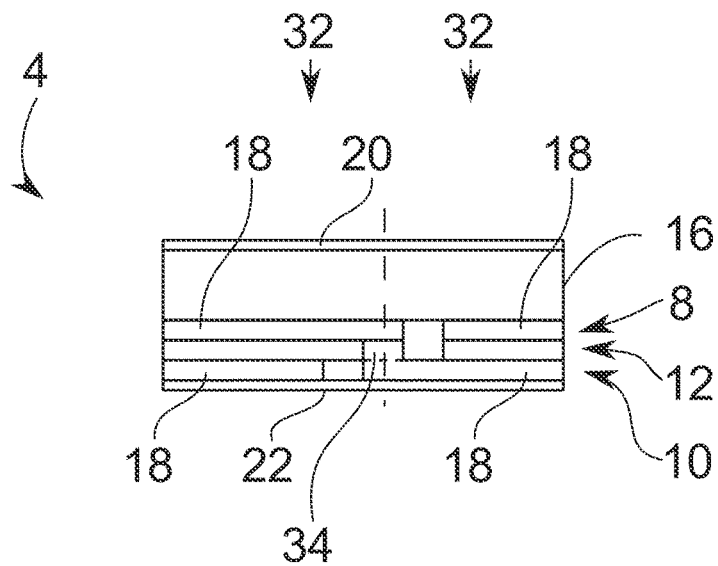
FIG. 4 shows the semiconductor module from FIG. 1 in a first sectional view.
Figure 5:
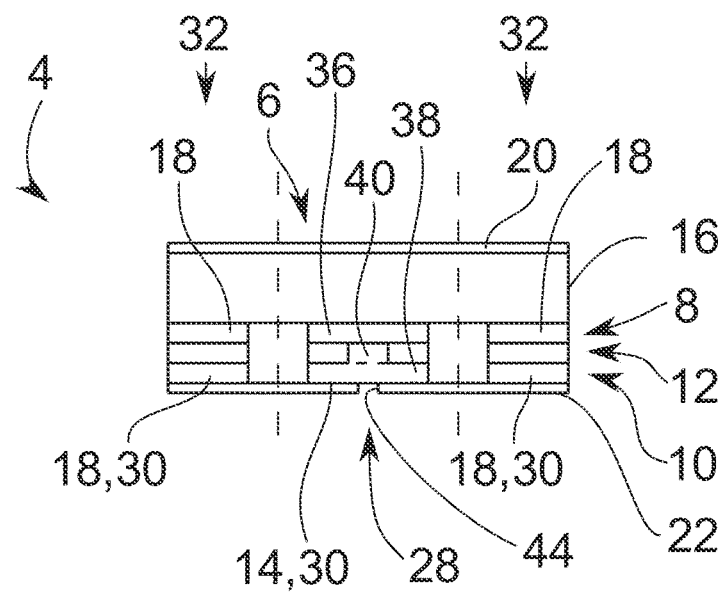
FIG. 5 shows the semiconductor module from FIG. 1 in a second sectional view.

FIG. 1 shows a detail from a semiconductor module 2 in a front view; FIG. 2 likewise shows a detail from this semiconductor module in a rear view. FIG. 3 shows the entire semiconductor module 2 in the rear view. The semiconductor module 2 comprises a layer structure 4, which is discernible especially in the two sectional views in FIGS. 4 and 5. In FIGS. 4 and 5, the front side or top side of the semiconductor module 2 is at the top in each case, and the rear side or underside is correspondingly at the bottom in each case. Furthermore, the semiconductor module 2 comprises at least one capacitive sensor 6, which is also referred to just as "sensor" for short. The layer structure 4 comprises an upper electrode layer 8 and a lower electrode layer 10 and also an active layer 12. The active layer 12 determines a first, original function of the semiconductor module 2; the capacitive sensor 6 then realizes a further, different function.

The semiconductor module 2 shown here is configured as an organic photovoltaic module and the layer structure 4 is accordingly configured for generating current by means of absorption of light in the active layer 12. For this purpose, the active layer is fabricated from one or more organic semiconductor materials. The first, original function of the semiconductor module 2 is then to generate current. However, the explanations given here analogously also apply to non-organic photovoltaic modules and to other organic and non-organic semiconductor modules 2, e.g. OLED modules or electronic paper and the like.

The sensor 6 here serves as an input element, specifically as a key, and is accordingly operable from outside by a person, e.g. with a finger. The sensor 6 is based on the principle that a change in capacitance is detected, resulting from a change in the surroundings of the sensor 6. The sensor 6 comprises a measuring electrode 14 integrated into the layer structure 4. The sensor 6 is thus a part of the layer structure 4 which already exists anyway. In the exemplary embodiment of the photovoltaic module with input element, the two functions of "generating current" and "input function" are then integrated in the layer structure 4 of the semiconductor module 2. The semiconductor module 2 shown here comprises six sensors 6, which moreover are configured in identical fashion, but other numbers of sensors 6 and/or other, including different, configurations of the sensors 6 and also other arrangements are also possible.

In the present case, the capacitive sensor 6 is directly integrated into that very layer structure 4 which actually realizes the original function of the semiconductor module 2. In this case, a part of the layer structure 4 is as it were rededicated and taken away from the original function in order instead to realize a different function. In the present case here, moreover, no other materials are used for the sensor 6, rather the latter is completely produced from materials which are used anyway to realize the original function. In the exemplary embodiment shown, a part of the layer structure 4 is then no longer used for generating current by absorption of light, but rather as a capacitive sensor 6.

Figure 6:
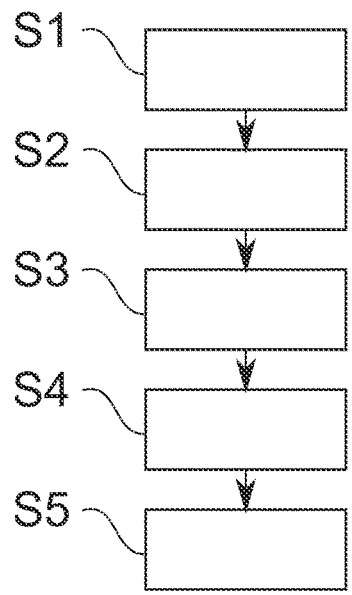
FIG. 6 shows a method for producing the semiconductor module from FIG. 1.

Firstly, one possible configuration of a method for producing the semiconductor module 2 will be described below. The method is presented as a flow diagram in FIG. 6. In principle, individual steps of said method can be used, modified, replaced or omitted independently of one another.

In a first step S1, the upper electrode layer 8 is formed, specifically here from a conductive and transparent material, e.g. IMI or ITO. The material is applied to a carrier layer 16, which is likewise fabricated from a transparent, but electrically insulating material, here a plastic, e.g. PET. The first step S1 is followed by a second step S2, in which the active layer 12 is applied to the upper electrode layer 8.

The upper electrode layer 8 is either formed directly in structured fashion in the first step S1 or alternatively firstly fabricated in continuous fashion, i.e. in unstructured fashion, and subdivision into a plurality of electrodes 18, which are electrically isolated from one another, then takes place for example after the application to the carrier layer 16 and before the application of the active layer 12, e.g. while still in the first step S1, or alternatively after the application of the active layer 12, e.g. in the second step S2. The structuring of the upper electrode layer 8 takes place in particular in a structuring step P1 or P1*.

In a third step S3, the active layer 12 is structured in such a way that a number of contact points are formed, at which the upper electrode layer 8 is exposed. In other words: the active layer 12 is perforated at a number of contact points in order later to be contacted with the lower electrode layer 10. In particular one or more of the structuring steps P1*, P2, P3 already described are carried out in the third step S3.

The third step S3 is followed by a fourth step S4, in which the lower electrode layer 10 is then applied to the active layer 12. The lower electrode layer 10 is fabricated from a conductive material, here from a metal, specifically silver. The lower electrode layer 10 is additionally configured here as a grid electrode and also already formed in structured fashion in the fourth step S4, i.e., with a plurality of lower electrodes 18, analogously to the upper electrode layer 8. The various electrodes 18 are not designated differently in the figures, for the sake of simplicity.

Finally, in the exemplary embodiment shown, in a fifth step S5, the stack comprising carrier layer 16, active layer 12 and electrode layers 8, 10 is encapsulated, namely surrounded with a protective cover 20, in order to protect the arrangement against environmental influences, e.g. the weather. The protective cover 20 is fabricated from a transparent plastic, e.g. PET, alternatively from a metal on at least one side 22, which metal however is insulated from the electrode layers 8, 10, e.g. by the side 22 being a metal-coated plastic film.

The two electrode layers 8, 10 and optionally also the protective cover 20 are thus fabricated in each case from a conductive material and are therefore suitable in each case for forming the measuring electrode 14 of the sensor 6. In the exemplary embodiment shown here, the sensor 6 is produced from the electrode layers 8, 10. This is discernible especially in the sectional view in FIG. 5. In this case, the production of the sensor 6 is distributed among those steps of the method in which the electrode layers 8, 10 are formed and structured. An embodiment in which the side 22 of the protective cover 20 serves as a sensor 6 is not explicitly shown, but one possible configuration follows directly from the illustration in FIGS. 1 to 5, in which the sensors 6 shown can then be omitted and instead or in addition the side 22 is used as a capacitive sensor 6.

The measuring electrode 14 here is potential-free and thus indeed not connected to a reference potential, specifically a ground potential, but rather is independent. This is discernible especially in FIG. 5. The photovoltaic module shown comprises a positive pole 24 and a negative pole 26, which are formed by the electrodes 18 of the two electrode layers 8, 10. FIGS. 2 and 3 also clearly reveal the busbar, not explicitly identified, which runs along the lower edge and leads to the positive pole 24. By contrast, the negative pole 26 is discernibly connected to the central electrode 18 of the lower electrode layer 10. The measuring electrode 14 is then connected neither to the positive pole 24 nor to the negative pole 26 of the semiconductor module 2, i.e. not to the cells 32 thereof either. If a respective sensor 6, as shown here, comprises just a single measuring electrode 14, the semiconductor module 2 also comprises merely a single connection pole 28 for the respective sensor 6.

Since the electrode layers 8, 10 are structured anyway in order to realize the original function of the semiconductor module 2, in the process the measuring electrode 14 of the sensor 6 is also formed and for this purpose is as it were cut out of one of the electrode layers 8, 10 and electrically insulated from the rest of the electrode layer 8, 10. In the exemplary embodiment shown, the measuring electrode 14 is formed from both electrode layers 8, 10, but in principle a variant which is not explicitly shown and in which the measuring electrode 14 is formed only from one of the two electrode layers 8, 10 is also suitable. In the case of the semiconductor module 2 shown, both electrode layers 8, 10 are structured and thereby comprise a plurality of partial regions 30, which are electrically isolated from one another. One of the plurality of partial regions 30 then forms the measuring electrode 14. The other partial regions 30 then each form an electrode 18 of a respective cell 32 of the semiconductor module 2. The partial regions 30 which are electrodes 18 are firstly separated from one another by the structuring, but then later are electrically connected to one another by means of cell vias 34. In FIG. 5, for the sake of clarity, the partial regions 30 are identified only for the lower electrode layer 10, but the figure makes it clear that the upper electrode layer 8 is also subdivided into partial regions 30. The cells 32 are illustrated by additional vertical dashed lines in FIGS. 4 and 5. In FIGS. 2 and 3, the cells 32 are likewise readily discernible on account of the structure of the lower electrode layer 10. In FIG. 1 an explicit illustration of the cells 32 has been dispensed with, but said cells are usually likewise readily distinguishable from one another on account of the structuring of the active layer 12. The location of a cell 32 is illustrated by way of example by means of vertical dashed lines in FIGS. 1 and 2.

In the exemplary embodiment shown, all the cells 32 are interconnected in series and arranged in a single row. This arrangement is advantageous for the device shown in FIG. 7. The arrangement and interconnection are not mandatory, however, but rather able to be fashioned in any desired way. In configurations that are not shown, the cells 32 are e.g. arranged in a matrix or shaped and/or arranged differently and/or the cells 32 are even dimensioned differently. A parallel connection is possible as well, or an interconnection comprising cells 32 interconnected both in series and in parallel.

The size, i.e. the dimensioning, of the measuring electrode 14 is basically able to be fashioned in any desired way and is therefore adapted here to the envisaged application. In this case, the size of the measuring electrode 14 is chosen to be as small as possible, however, in order to obtain as much area of the semiconductor module 2 as possible for the first, original function thereof. In the case as provided here where the sensor 6 is used as an input element, for operation with a finger, it is sufficient if the measuring electrode 14, as shown here, is configured with a square shape having an edge length K of 1 mm to 10 mm, e.g. 8 mm.

The measuring electrode 14 shown here is formed—as is discernible in FIGS. 5—from an upper part 36, which is a partial region 30 of the upper electrode layer 8, and a lower part 38, which is a partial region 30 of the lower electrode layer 10, wherein the upper part 36 and the lower part 38 are electrically connected by means of a via 40 through the active layer 12. In this configuration, the measuring electrode 14 is produced completely by means of such method steps which are also used for producing the cells 32, e.g. as already described further above.

As already indicated, the layer structure 4 is structured in such a way that it comprises a plurality of cells 32. In this case, the via 40 is then produced jointly with one or more further vias 34, by means of which the cells 32 are electrically interconnected. The vias 34 for connecting the cells 32 are also referred to as cell vias 34. Both electrode layers 8, 10 are structured in each case in order to form the electrodes 18 of the cells 32; at the same time here the upper part 36 and the lower part 38 are formed analogously to the electrodes 18, optionally with a different shape. Furthermore, one or more vias 34 are formed which extend through the active layer 12 and electrically connect the electrodes 18 to one another in order to interconnect the cells 32 in series or in parallel, or a combination thereof. In this case, at least one via 40 is then also formed which connects the upper part 36 to the lower part 38, such that these are then short-circuited. In the exemplary embodiment shown here, the upper part 36 and the lower part 38 are also formed in a manner such that one lies above the other, and are indeed not offset with respect to one another, and are also of the same size and also have the same shape.

In the present case, the respective via 40 is also used to indicate the position of the sensor 6 to a user. This is discernible particularly clearly in FIG. 1 and FIG. 7. For this purpose, the via 40 is visible from outside and thereby marks the position of the capacitive sensor 6 in the semiconductor module 2. The via 40 is accordingly used in a targeted manner as a marking, the production of which is completely integrated into the production of the semiconductor module 2. Specifically, the marking of the sensor 6 takes place during the production of the vias 34, 40.

The upper electrode layer 8 is fabricated from a transparent material, as already described. As a result, the via 40 and the active layer 12 are visible through the upper electrode layer 8. Furthermore, the via 40 is produced from a different material than the active layer 12 and thereby contrasts optically with the active layer 12.

A respective via 34, 40 is produced by a procedure in which the active layer 12 is structured in a structuring step, i.e. the active material is regionally removed or omitted from the outset, and instead electrically conductive material is then inserted. In the present case, the via 40 of the measuring electrode 14 is produced simultaneously with the lower electrode layer 10 and is thus automatically produced from the same material as the lower electrode layer 10.

Moreover, the vias 40 shown here are configured in the form of a graphic character or pictorial symbol. This makes it possible not only to indicate the position of the sensor 6 but also to specify a function linked therewith. The graphic characters and/or pictorial symbols shown here are logically merely by way of example. In principle, it is also possible to form a plurality of vias 40 for a single sensor 6 in order to represent more complex images or combinations of a plurality of graphic characters.

Figure 7:
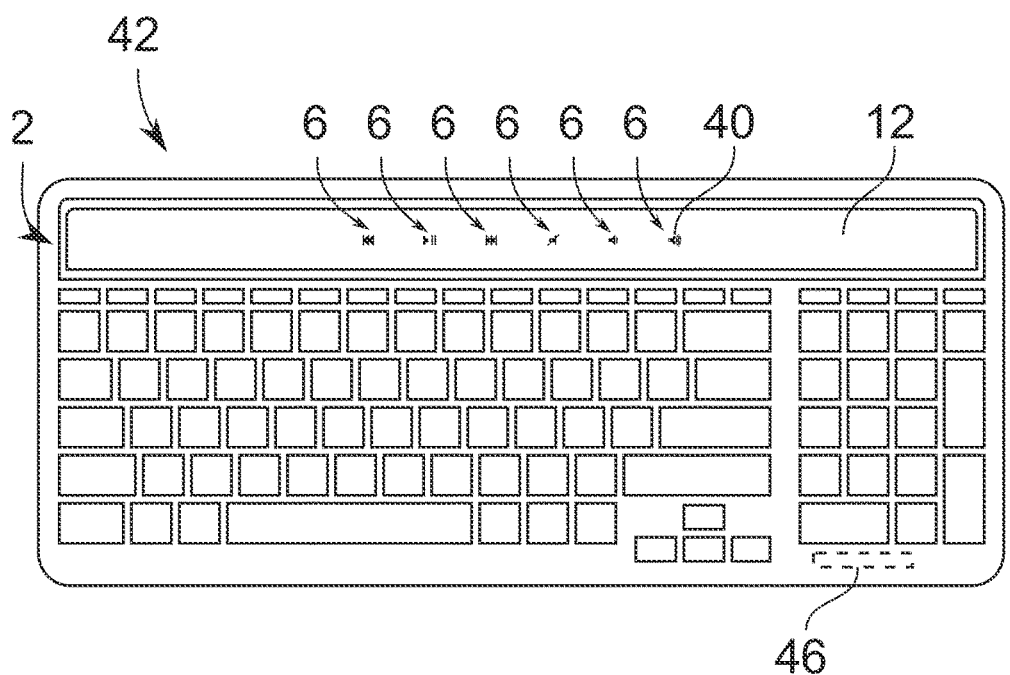
FIG. 7 shows a device comprising a semiconductor module as in FIG. 1.

FIG. 7 then shows—as already indicated—one exemplary embodiment of a device 42, here a keyboard, which comprises a semiconductor module 2 having a plurality of capacitive sensors 6 serving as input elements for a media player. The six vias 40 (only one of which is explicitly identified in FIG. 7) are accordingly configured as pictorial symbols and contrast with the active layer 12 in order to identify the position of the sensors 6. The semiconductor module 2 in FIG. 7 corresponds to the semiconductor module 2 in FIGS. 1 to 5, but other configurations are possible. The device 42, on account of its configuration as a keyboard, additionally comprises a plurality of keys, which are not explicitly labeled in FIG. 7, for the sake of clarity, but possible labeling with letters, numbers and other symbols is directly discernible from the layout of the keys.

As is discernible especially in FIGS. 2, 3 and 5, the semiconductor module 2 comprises a cutout 44, which is circular here by way of example, on the rear side, for connecting the measuring electrode 14 to an evaluation unit 46. The cutout 44 here is introduced into a protective cover 20 of the semiconductor module 2, such that the measuring electrode 14 is electrically accessible. Analogously, the semiconductor module 2 also comprises two cutouts, not explicitly designated, for connecting the cells 32, more precisely the electrodes 18 thereof, i.e. cutouts for the positive pole 24 and the negative pole 26.

One evaluation unit 46 for the sensors 6 is integrated into the device 42 in FIG. 7. The measuring electrode 14 is then connected to the evaluation unit 46, for the purpose of evaluating a signal of the respective sensor 6.

LIST OF REFERENCE SIGNS 2 semiconductor module
4 layer structure
6 sensor
8 upper electrode layer
10 lower electrode layer
12 active layer
14 measuring electrode
16 carrier layer
18 electrode
20 protective cover
22 side (of the protective cover)
24 positive pole
26 negative pole
28 connection pole
30 partial region
32 cell
34 cell via, via
36 upper part
38 lower part
40 via
42 device
44 cutout
46 evaluation unit
K edge length
S1 first step
S2 second step
S3 third step
S4 fourth step
S5 fifth step

The invention claimed is:

1. A semiconductor module, comprising:
a layer structure formed with an upper electrode layer, a lower electrode layer, and an active layer arranged between said upper and lower electrode layers and produced from a semiconductor material; and
at least one capacitive sensor having a measuring electrode integrated into said layer structure;
said measuring electrode being formed of an upper part, being a partial region of said upper electrode layer, and a lower part, being a partial region of said lower electrode layer; and
said upper part and said lower part being electrically connected by way of a via through said active layer of said layer structure; and
wherein said via is visible from outside and thereby marks a position of said capacitive sensor in the semiconductor module.

2. The semiconductor module according to claim 1, configured as an organic photovoltaic module with said layer structure being configured for generating electric current by way of absorption of light in said active layer.

3. The semiconductor module according to claim 1, wherein said measuring electrode is a potential-free electrode.

4. The semiconductor module according to claim 1, wherein:
at least one of said upper and lower electrode layers is structured with a plurality of partial regions that electrically insulated from one another; and
one of said plurality of partial regions forms said measuring electrode.

5. A semiconductor module, comprising:
a layer structure formed with an upper electrode layer, a lower electrode layer, and an active layer arranged between said upper and lower electrode layers and produced from a semiconductor material; and
at least one capacitive sensor having a measuring electrode integrated into said layer structure;
said measuring electrode being formed of an upper part, being a partial region of said upper electrode layer, and a lower part, being a partial region of said lower electrode layer; and
said upper part and said lower part being electrically connected by way of a via through said active layer of said layer structure, wherein:
said upper electrode layer is formed of a transparent material, rendering said via and said active layer visible through said upper electrode layer; and
said via is produced from a material that is different from a material of said active layer and forms an optical contrast with said active layer.

6. A semiconductor module, comprising:
a layer structure formed with an upper electrode layer, a lower electrode layer, and an active layer arranged between said upper and lower electrode layers and produced from a semiconductor material; and
at least one capacitive sensor having a measuring electrode integrated into said layer structure;
said measuring electrode being formed of an upper part, being a partial region of said upper electrode layer, and a lower part, being a partial region of said lower electrode layer; and
said upper part and said lower part being electrically connected by way of a via through said active layer of said layer structure, wherein said via is produced simultaneously with said lower electrode layer and is produced from the same material as said lower electrode layer.

7. The semiconductor module according to claim 1, wherein said via is formed as a graphic character or a pictorial symbol.

8. A semiconductor module, comprising:
a layer structure formed with an upper electrode layer, lower electrode layer, and an active layer arranged between said upper and lower electrode layers and produced from a semiconductor material; and at least one capacitive sensor having a measuring electrode integrated into said layer structure;

said measuring electrode being formed of an upper part, being a partial region of said upper electrode layer, and a lower part, being a partial region of said lower electrode layer; and said upper part and said lower part being electrically connected by way of a via through said active layer of said layer structure, wherein:

said layer structure is structured with a plurality of cells; and said via is produced jointly with one or more further vias that are disposed to electrically interconnect said cells.

9. The semiconductor module according to claim 1, wherein the semiconductor module has a rear side formed with a cutout for connecting said measuring electrode to an evaluation unit.

10. A device, comprising a semiconductor module according to claim 1, with the capacitive sensor thereof serving as an input element.

11. The device according to claim 10 configured as an input device.

12. A method for producing a semiconductor module, the method comprising:

forming a layer structure of the semiconductor module with an upper electrode layer and a lower electrode layer, and an active layer of semiconductor material between the upper and lower electrode layers;

forming a capacitive sensor of the semiconductor module with a measuring electrode integrated into the layer structure;

forming the measuring electrode of the capacitive sensor with an upper part, being a partial region of the upper electrode layer, and with a lower part, being a partial region of the lower electrode layer; and electrically connecting the upper part and the lower part by a via through the active layer, the via being visible from outside and thereby marking a position of the capacitive sensor in the semiconductor module.

* * * * *